(12) United States Patent
Momiuchi et al.

(10) Patent No.: US 11,356,584 B2
(45) Date of Patent: Jun. 7, 2022

(54) CAMERA MODULE, PRODUCTION METHOD, AND ELECTRONIC DEVICE

(71) Applicant: SONY SEMICONDUCTOR SOLUTIONS CORPORATION, Kanagawa (JP)

(72) Inventors: Yuta Momiuchi, Kanagawa (JP); Yuji Takaoka, Kanagawa (JP); Hirokazu Nakayama, Kanagawa (JP); Kiyohisa Tanaka, Kanagawa (JP); Miyoshi Togawa, Oita (JP); Hirokazu Seki, Oita (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 415 days.

(21) Appl. No.: 16/328,433

(22) PCT Filed: Sep. 8, 2017

(86) PCT No.: PCT/JP2017/032392
§ 371 (c)(1),
(2) Date: Feb. 26, 2019

(87) PCT Pub. No.: WO2018/056069
PCT Pub. Date: Mar. 29, 2018

(65) Prior Publication Data
US 2021/0281721 A1    Sep. 9, 2021

(30) Foreign Application Priority Data

Sep. 23, 2016   (JP) .............................. JP2016-185347

(51) Int. Cl.
*H04N 5/225* (2006.01)
*H04N 5/232* (2006.01)
(Continued)

(52) U.S. Cl.
CPC ......... *H04N 5/2254* (2013.01); *H04N 5/2253* (2013.01); *H04N 5/23229* (2013.01); *H05K 1/0274* (2013.01); *H05K 1/0281* (2013.01)

(58) Field of Classification Search
CPC ... H04N 5/2253; H04N 5/2254; H05K 1/0281
See application file for complete search history.

(56) References Cited

U.S. PATENT DOCUMENTS

2005/0035421 A1    2/2005   Kayanuma et al.
2005/0285973 A1   12/2005   Singh et al.
(Continued)

FOREIGN PATENT DOCUMENTS

| CA | 2571345 A1 | 2/2006 |
|---|---|---|
| CN | 1599428 A | 3/2005 |

(Continued)

OTHER PUBLICATIONS

International Search Report and Written Opinion of PCT Application No. PCT/JP2017/032392, dated Oct. 31, 2017, 06 pages of ISRWO.

(Continued)

*Primary Examiner* — Christopher K Peterson
(74) *Attorney, Agent, or Firm* — Chip Law Group

(57) ABSTRACT

The present technology relates to a camera module, a production method, and an electronic device that can prevent reduction of optical module positioning accuracy or heat dissipation performance. An image pickup element is joined on one face of a flexible board so that a light receiving surface of the image pickup element is exposed through an opening of the flexible board, and an optical module is joined on an other face of the flexible board. A reinforcing member is joined on the one face of the flexible board at a circumference of the image pickup element and reinforces a joining part of the flexible board where the optical module (Continued)

is joined. The reinforcing member is joined so as to face an area including at least a part of the joining part and is formed so that a part of the circumference of the image pickup element is kept open.

9 Claims, 10 Drawing Sheets

(51) Int. Cl.
*H05K 1/02* (2006.01)
*G03B 17/02* (2021.01)
*G02B 7/02* (2021.01)
*G03B 17/55* (2021.01)

(56) References Cited

U.S. PATENT DOCUMENTS

| | | | |
|---|---|---|---|
| 2006/0087018 A1* | 4/2006 | Chao | H01L 25/167 257/680 |
| 2007/0084118 A1 | 4/2007 | Kaeding et al. | |
| 2007/0183773 A1 | 8/2007 | Aoki et al. | |
| 2007/0263116 A1* | 11/2007 | Sakurai | H01L 31/02325 348/340 |
| 2011/0084118 A1 | 4/2011 | Wada et al. | |
| 2014/0247389 A1 | 9/2014 | Lee | |
| 2016/0142599 A1 | 5/2016 | Shimizu et al. | |

FOREIGN PATENT DOCUMENTS

| | | |
|---|---|---|
| CN | 101432759 A | 5/2009 |
| CN | 102790854 A | 11/2012 |
| CN | 107112331 A | 8/2017 |
| DE | 102004039018 A1 | 4/2005 |
| EP | 1774453 A2 | 4/2007 |
| JP | 2008-504739 A | 2/2008 |
| JP | 4441211 B2 | 3/2010 |
| JP | 2013-200396 A | 10/2013 |
| JP | 5535570 A2 | 7/2014 |
| JP | 5764781 B2 | 8/2015 |
| JP | 5877595 B2 | 3/2016 |
| KR | 10-2005-0016220 A | 2/2005 |
| KR | 10-2007-0023300 A | 2/2007 |
| KR | 10-2007-0079920 A | 8/2007 |
| KR | 10-0873248 B1 | 12/2008 |
| KR | 10-1133135 B1 | 4/2012 |
| KR | 10-2017-0088344 A | 8/2017 |
| TW | 200511818 A | 3/2005 |
| TW | I262710 B | 9/2006 |
| TW | I411295 B | 10/2013 |
| TW | I437301 B | 5/2014 |
| TW | 201620285 A | 6/2016 |
| WO | 2006/012139 A2 | 2/2006 |
| WO | 2015/016043 A1 | 2/2015 |
| WO | 2016/084632 A1 | 6/2016 |

OTHER PUBLICATIONS

Extended European Search Report of EP Application No. 17852846.9, dated Jul. 29, 2019, 09 pages.
Office Action for CN Patent Application No. 1599428, dated Nov. 18, 2020.
Office Action for KR Patent Application No. 10-2019-7007444, dated Oct. 16, 2021, 04 pages of English Translation and 05 pages of Office Action.
Office Action for TW Patent Application No. 201817221, dated Jul. 28, 2021.

* cited by examiner

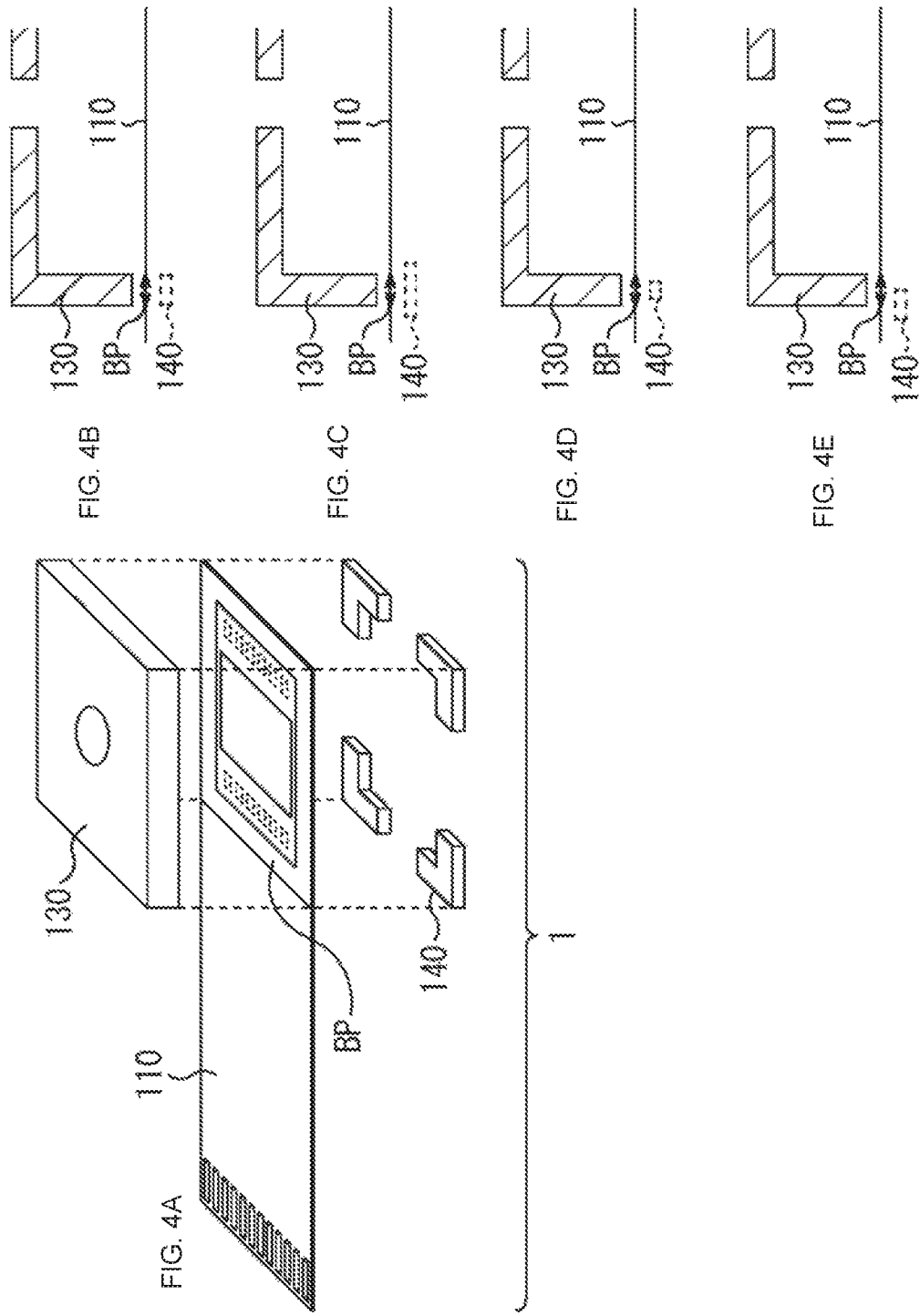

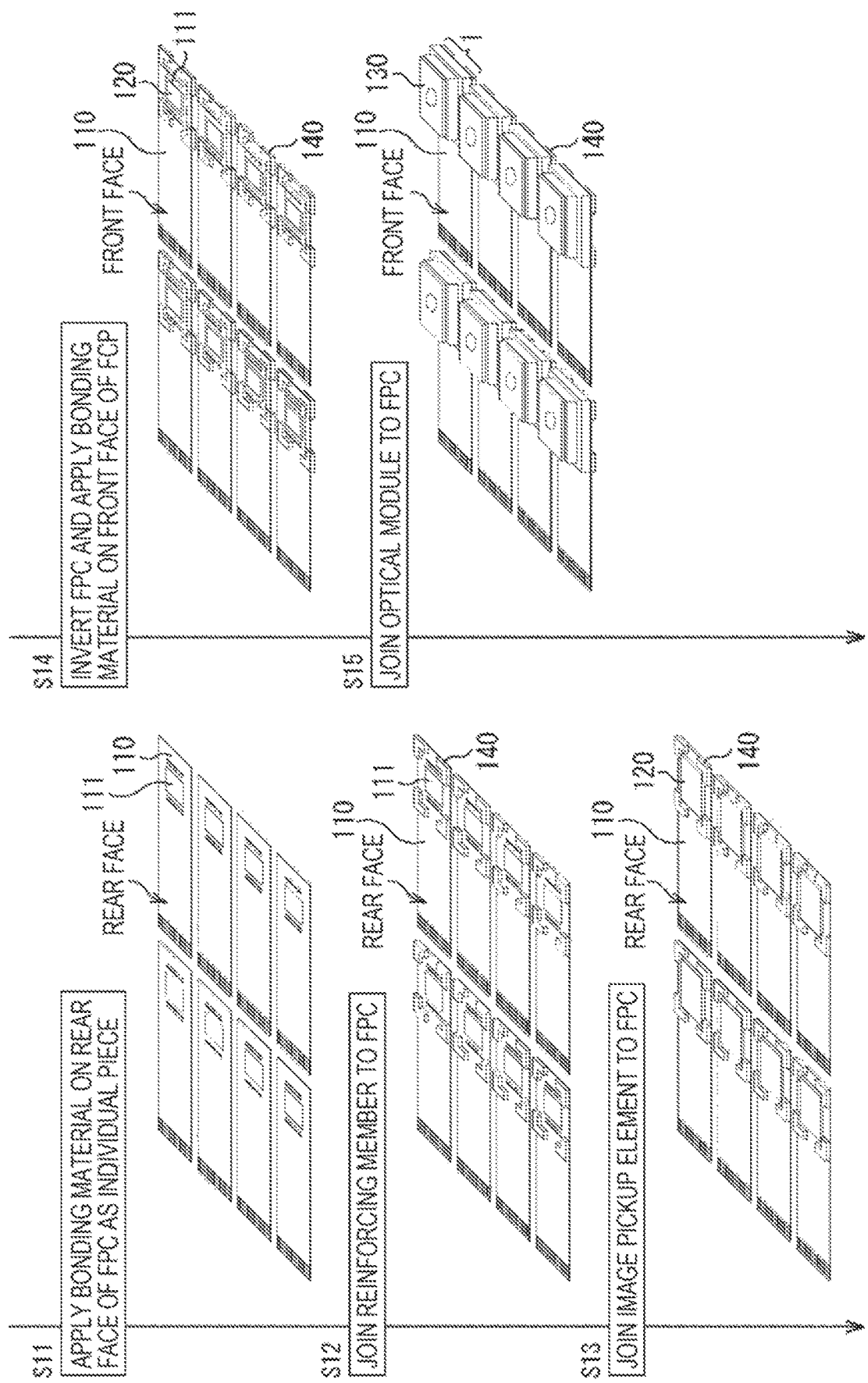

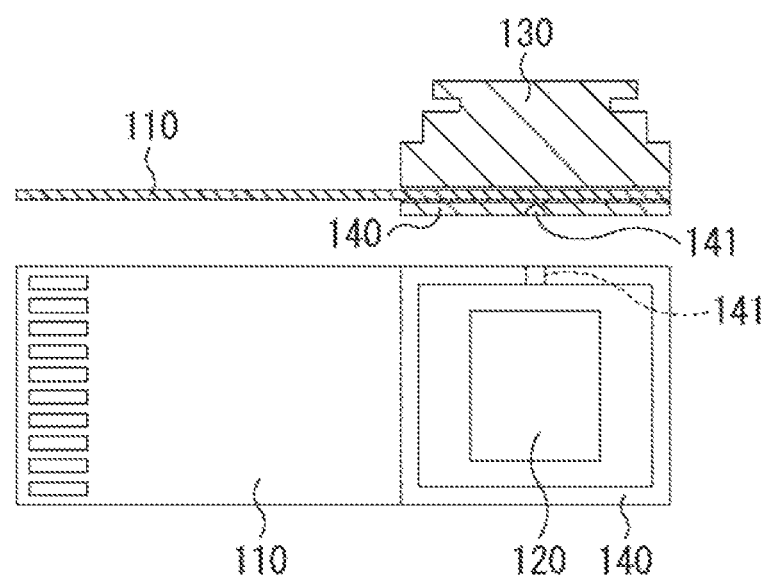

CAMERA MODULE, PRODUCTION METHOD, AND ELECTRONIC DEVICE

CROSS REFERENCE TO RELATED APPLICATIONS

This application is a U.S. National Phase of International Patent Application No PCT/JP2017/032392 filed on Sep. 8, 2017, which claims priority benefit of Japanese Patent Application No. JP 2016-185347 filed in the Japan Patent Office on Sep. 23, 2016. Each of the above-referenced applications is hereby incorporated herein by reference in its entirety.

TECHNICAL FIELD

The present technology relates to a camera module, a production method, and an electronic device and, more particularly, relates to a camera module, a production method, and an electronic device that can prevent reduction of optical module positioning accuracy or heat dissipation performance, for example.

BACKGROUND ART

As mobile devices become thinner, there has been a greater demand for reducing a size and a height of a camera module mounted in those mobile devices and a package of an image pickup element included in the camera module.

As a technology to meet the demand for reducing the height of the camera module, there is a technology, for example, for composing a camera module by mounting an image pickup element on a circuit board, such as a flexible board having an opening, with flip-chip bonding or the like and attaching an optical module to the circuit board on its face opposite to the face where the image pickup element is mounted.

With such a camera module having a so-called sandwich structure, in which the circuit board is placed between the optical module and the image pickup element, an area of Au lead for chip on board (COB) is not needed and, therefore, downsizing of the camera module or simplification of processes can be realized.

Furthermore, with the camera module having a sandwich structure, a ball grid array (BGA), a cover glass, and the like to be mounted on a chip size package (CSP), are not needed and the height of the camera module can be reduced, as compared to a camera module using a CSP.

Here, in a case where a board having flexibility such as a flexible board or the like is used as the circuit board composing the camera module in a sandwich structure, since the image pickup element or the circuit element such as a chip capacitor or the like are mounted on the circuit board, a stepped part (unevenness) is generated on a face of the flexible board, where the image pickup element is mounted.

Therefore, the flexible board may be deformed about a corner part of the stepped part due to a force applied to the flexible board when an optical module is mounted on a face of the flexible board, which is opposite to the face where the stepped part is generated, and accuracy of the position where the optical module is to be mounted may be reduced.

Furthermore, due to the deformation of the flexible board, stress may be applied to a connection part between the flexible board and the image pickup element and a connection failure may be caused at the connection part.

In view of the above, Patent Document 1 describes a camera module in which a frame member including a conductive electrode that conducts a signal in a thickness direction is provided at a circumference of a circuit board, the conductive electrode of the frame member conducts a signal of an image pickup element mounted on the circuit board to outside from a lower part of the frame member.

CITATION LIST

Patent Document

Patent Document 1: Japanese Patent No. 4,441,211

SUMMARY OF THE INVENTION

Problems to be Solved by the Invention

Regarding the camera module having a sandwich structure, it is needed to prevent reduction of optical module positioning accuracy.

Furthermore, according to the camera module described in Patent Document 1, since the circumference of the image pickup element is sealed by the frame member, its air permeability, that is, heat dissipation performance to release heat generated by the image pickup element, is low.

The present technology has been made in view of the above situation and can prevent reduction of the optical module positioning accuracy and heat dissipation performance.

Solutions to Problems

A camera module according to the present technology is a camera module including a flexible board having an opening corresponding to a light receiving surface of an image pickup element, which includes the light receiving surface to receive light, the image pickup element joined to one face of the flexible board so that the light receiving surface is exposed through the opening, an optical module joined to an other face of the flexible board so that the light enters to the image pickup element through the opening, and a reinforcing member joined to the one face of the flexible board at a circumference of the image pickup element and configured to reinforce a joining part of the flexible board where the optical module is joined, in which the reinforcing member is joined so as to face an area including at least a part of the joining part and is formed so that a part of the circumference of the image pickup element is kept open.

A production method according to the present technology is a camera module production method including joining an image pickup element to one face of a flexible board that has an opening corresponding to a light receiving surface of the image pickup element, which includes the light receiving surface to receive light, so that the light receiving surface is exposed through the opening, and joining a reinforcing member on the flexible board at a circumference of the image pickup element to reinforce a joining part of the flexible board where an optical module is joined, and joining the optical module on an other side of the flexible board so that the light enters to the image pickup element through the opening, in which the reinforcing member is joined so as to face an area including at least a part of the joining part and is formed so that a part of the circumference of the image pickup element is kept open.

An electronic device according to the present technology is an electronic device including a camera module configured to capture an image, and a signal processor configured to perform signal processing on the image captured by the camera module, in which the camera module includes a flexible board having an opening corresponding to a light receiving surface of an image pickup element, which includes the light receiving surface to receive light, the image pickup element joined to one face of the flexible board so that the light receiving surface is exposed through the opening, an optical module joined to an other face of the flexible board so that the light enters to the image pickup element through the opening, and a reinforcing member joined to the one face of the flexible board at a circumference of the image pickup element and configured to reinforce a joining part of the flexible board where the optical module is joined, and the reinforcing member is joined so as to face an area including at least a part of the joining part and is formed so that a part of the circumference of the image pickup element is kept open.

In the camera module and electronic device according to the present technology, the flexible board has the opening corresponding to the light receiving surface of the image pickup element, which includes the light receiving surface to receive light, the image pickup element is joined on the one face of the flexible board so that the light receiving surface is exposed through the opening, and the optical module is joined on the other face of the flexible board so that light enters to the image pickup element through the opening. The reinforcing member is joined on the other side of the flexible board at the circumference of the image pickup element and reinforces the joining part of the flexible board where the optical module is joined. The reinforcing member is joined so as to face the area including at least a part of the joining part and is formed so that a part of the circumference of the image pickup element is kept open.

In the production method according to the present technology, the image pickup element is joined on the one face of the flexible board having the opening corresponding to the light receiving surface of the image pickup element, which includes the light receiving surface to receive light, so that the light receiving surface is exposed through the opening, and the reinforcing member that reinforces the joining part of the flexible board where the optical module is joined is joined to the flexible board at the circumference of the image pickup element. Furthermore, the optical module is joined on the other face of the flexible board so that the light enters to the image pickup element through the opening. The reinforcing member is joined so as to face the area including at least a part of the joining part and is formed so that a part of the circumference of the image pickup element is kept open.

Note that the camera module may be an independent device or may be an internal block included in a device.

Effects of the Invention

The present technology can prevent reduction of optical module positioning accuracy or heat dissipation performance.

Note that effects described here should not be limited and there may be any effect described in the present disclosure.

BRIEF DESCRIPTION OF DRAWINGS

FIGS. 4A, 4B, 4C, 4D, and 4E are diagrams for describing how a reinforcing member 140 is joined to a flexible board 110.

FIG. 5 is a diagram for describing an example of a production method of the camera module 1.

FIG. 7 is a diagram illustrating another configuration example of the reinforcing member 140.

MODE FOR CARRYING OUT THE INVENTION

<Embodiment of Digital Camera Using the Present Technology>

Figure 1:
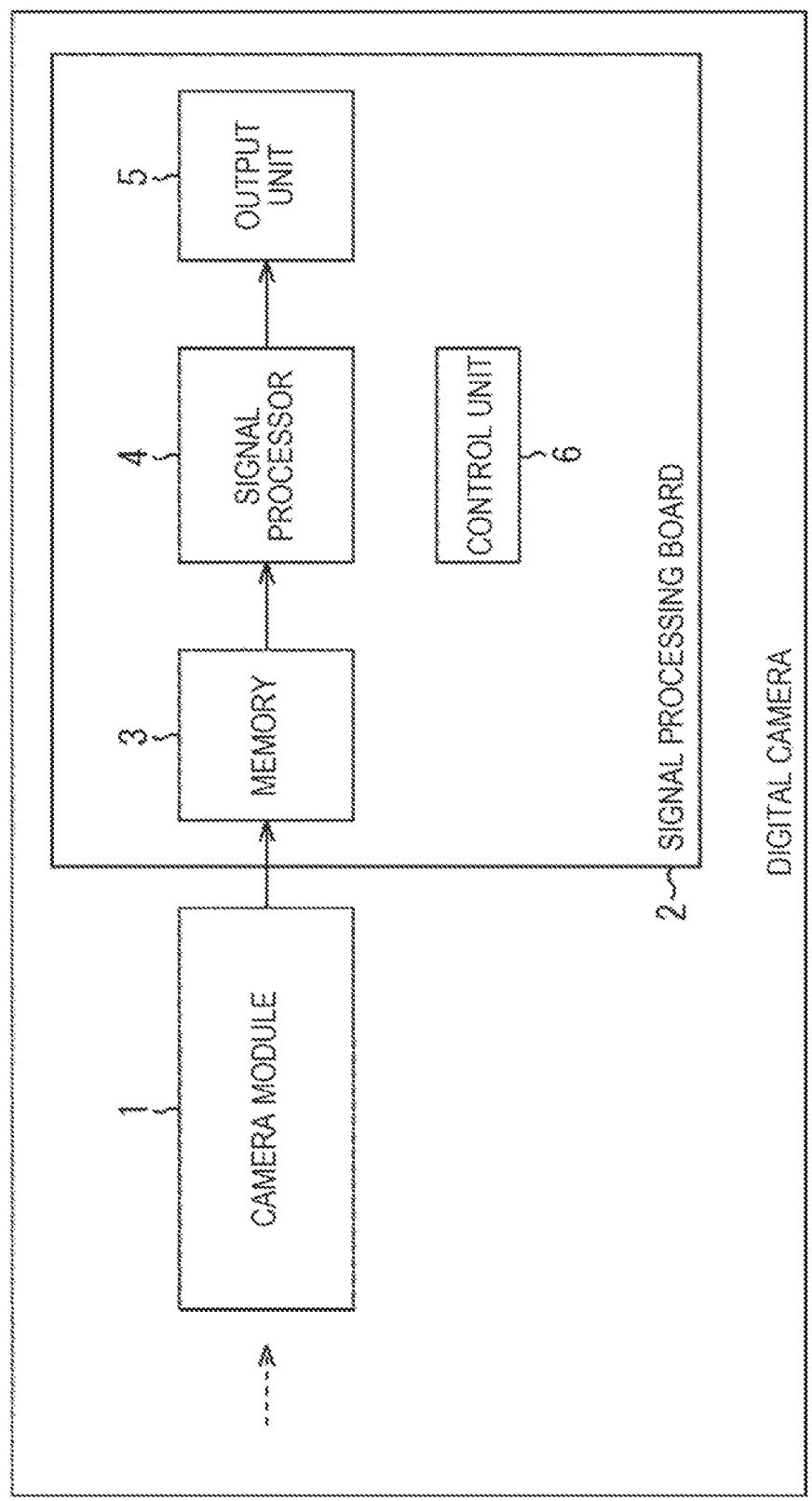
FIG. 1 is a block diagram illustrating a configuration example of an embodiment of a digital camera using the present technology.

FIG. 1 is a block diagram illustrating a configuration example of an embodiment of a digital camera using the present technology.

The digital camera can capture both of a still image and a moving image.

In FIG. 1, the digital camera includes a camera module 1 and a signal processing board 2.

The camera module 1 receives incident light entering therein, performs a photoelectric conversion, and outputs image data corresponding to the incident light.

The signal processing board 2 processes the image data output from the camera module 1.

In other words, the signal processing board 2 includes a memory 3, a signal processor 4, an output unit 5, and a control unit 6.

The memory 3 temporarily stores the image data output from the camera module 1.

The signal processor 4 performs various processing such as a noise removal, a white balance adjustment, and the like, for example, as signal processing on the image data stored in the memory 3, and provides processed image data to the output unit 5.

The output unit 5 outputs the image data received from the signal processor 4.

In other words, the output unit 5, for example, includes a display (not shown) including a liquid crystal, or the like and displays an image corresponding to the image data from the signal processor 4 as a so-called through image.

Furthermore, the output unit 5, for example, includes a driver (not shown) that drives a recording medium such as a semiconductor memory, a magnetic disk, an optical disk, and the like and records the image data received from the signal processor 4 to the recording medium.

Furthermore, the output unit 5 functions as an Interface (I/F) that transfers data to and from an external device, for example, and transfers the image data from the signal processor 4 or the image data recorded in the recording medium to the external device.

The control unit 6 controls respective blocks included in the digital camera, according to user's operation and the like.

In the digital camera composed as described above, the camera module 1 receives incident light and outputs image data corresponding to the incident light.

The image data output from the camera module 1 is provided to the memory 3 and stored. On the image data stored in the memory 3, signal processing is performed by the signal processor 4 and the image data obtained as a result is provided to the output unit 5 and output.

<Configuration Example of Camera Module 1>

Figure 2:
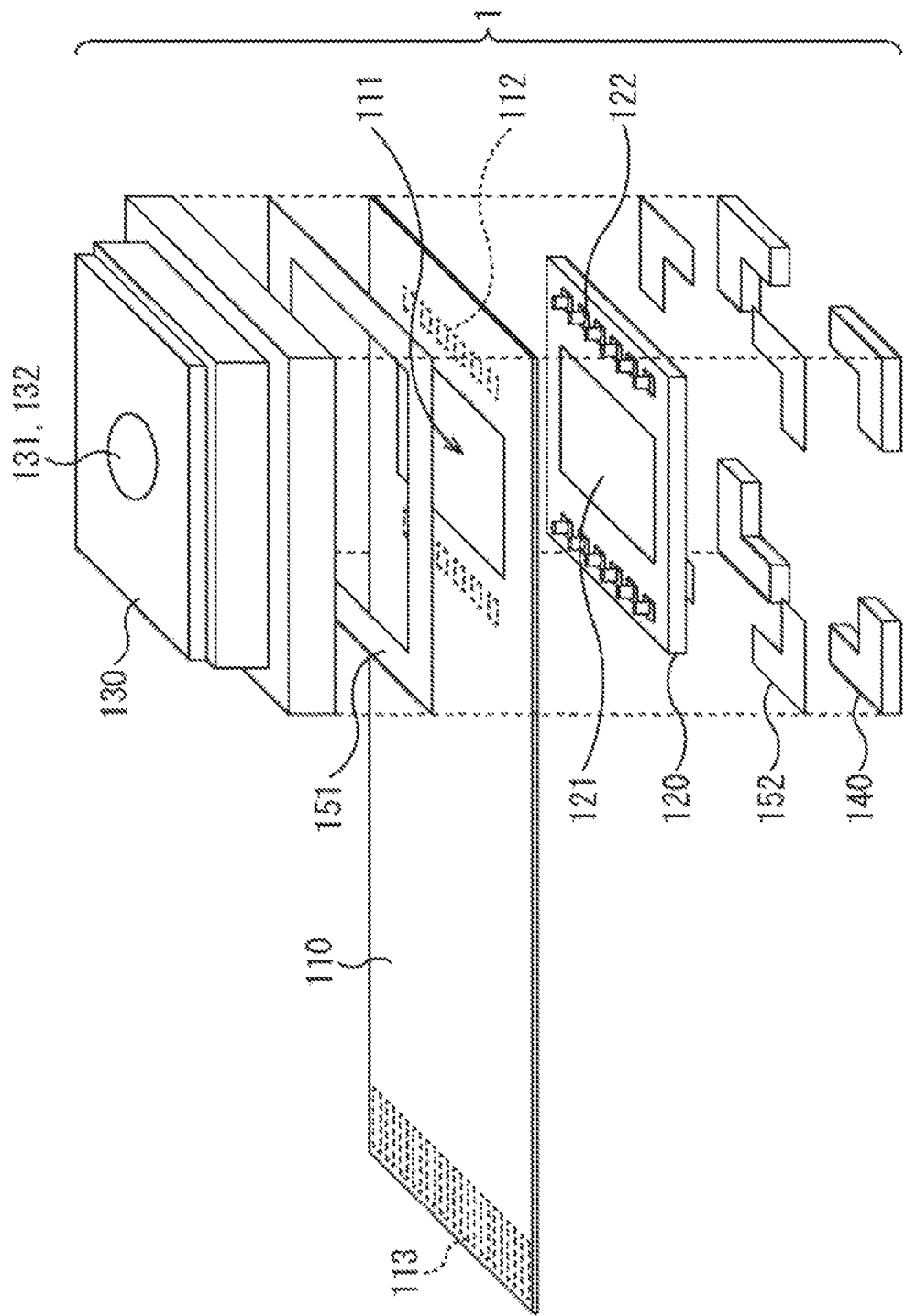
FIG. 2 is an exploded perspective view illustrating a configuration example of a camera module 1.
Figure 3:
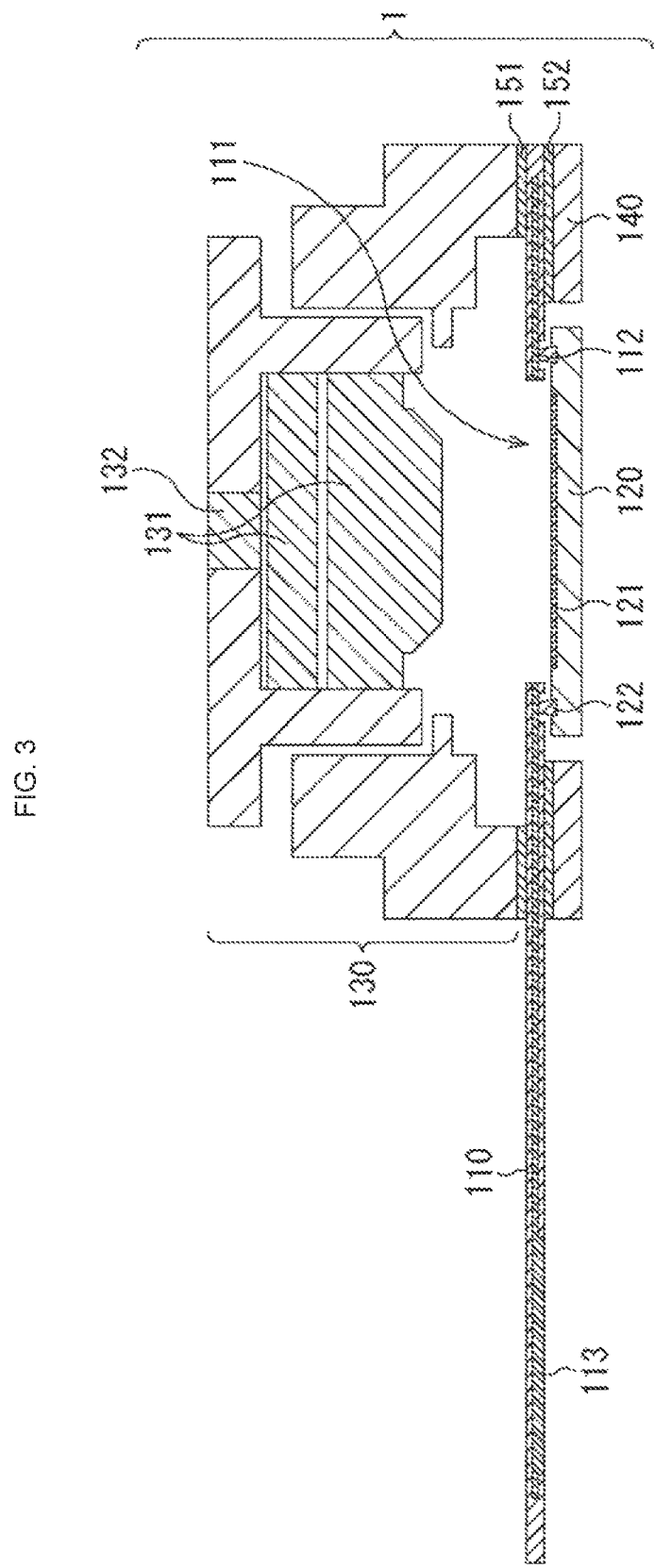
FIG. 3 is a sectional view of the configuration example of the camera module 1.

FIG. 2 is an exploded perspective view illustrating a configuration example of the camera module 1 and FIG. 3 is a sectional view illustrating the configuration example of the camera module 1.

The camera module 1 includes a flexible board 110, an image pickup element 120, an optical module 130, and a reinforcing member 140 and is formed in a sandwich structure in which the flexible board 110 is placed between the image pickup element 120 and the optical module 130.

The flexible board 110 has an opening 111, joining terminals 112, and mounting electrodes 113, and forms a circuit for transferring a signal between the image pickup element 120 and a passive element or an external circuit board, which are not illustrated in FIG. 2 and FIG. 3.

The opening 111 is a rectangular-shaped opening corresponding to a light receiving surface 121 of the image pickup element 120 and the size of the opening 111 is equal to or larger than the size of the light receiving surface 121. The joining terminals 112 are electrically connected to the image pickup element 120. The mounting electrodes 113 are electrically connected to the signal processing board 2 or an external circuit board such as an unillustrated motherboard.

According to the present embodiment, the flexible board 110 is in a horizontally long rectangle shape and the opening 111 is formed at a position close to a right edge of the flexible board 110, and the mounting electrodes 113 are exposed at a position close to a left side of the flexible board 110.

In the flexible board 110, the joining terminals 112 are electrically connected to the mounting electrodes 113 and thus can transmit, via the mounting electrodes 113, an electrical signal including a power source to the image pickup element 120, which is electrically connected to the joining terminals 112.

The image pickup element 120 is, for example, a complementary metal oxide semiconductor (CMOS) image sensor and includes the light receiving surface 121, which has a photoelectric conversion element such as unillustrated plurality of photo diodes (PD) arranged in a matrix and receives light.

Furthermore, in the light receiving surface 121 side of the image pickup element 120, bumps (electrodes) 122 are formed.

The image pickup element 120 is joined to a rear face (the lower face in FIG. 2 and FIG. 3) as one face of the flexible board 110 by a flip-chip bonding technique that connects the joining terminal 112 and bump 122, for example.

The image pickup element 120 is joined to the flexible board 110 so that the light receiving surface 121 of the image pickup element 120 is exposed through the opening 111 of the flexible board 110.

Note that, as the bump 122, for example, a metal stud bump or the like can be used. As a material of the bump 122, any material that electrically connects the flexible board 110 and the image pickup element 120 can be selected.

The optical module 130 is a module in which a part of an optical system such as a lens 131 or an unillustrated diaphragm is mounted, and includes a substantially box-shaped package (housing) in which its bottom side is open, its inside is hollowed, and its upper face has an opening to let light enter to the lens 131. To the opening of the optical module 130, a transparent member 132 for protecting the lens 131 is provided.

The optical module 130 is joined to the flexible board 110 on its face, which is not the face where the image pickup element 110 is joined, that is, a front face as the other face of the flexible board 110 (the upper face in FIG. 2 and FIG. 3) so that the light enters to the image pickup element 120 through the opening 111.

The optical module 130 is joined to the flexible board 110 by using a bonding material 151 so that light enters to the image pickup element 120 through the opening 111 of the flexible board 110.

Here, when the optical module 130 is joined to the flexible board 110, a size of an outer circumferential of a contact part of the flexible board 110 (or a contact part of the optical module 130) to be joined to the optical module 130 is larger than a size of an outer circumferential of the image pickup element 120.

Therefore, in a cross-section view of the camera module 1, the optical module 130 is placed so that an edge of the optical module 130 projects outside the image pickup element 110 (a position outside the image pickup element 120).

Therefore, in a case where the camera module 1 is produced by joining the optical module 130 to the flexible board 110 after joining the image pickup element 120, a part of the flexible board 110 to be joined to the optical module 130 is pressed by the optical module 130 and the flexible board 110 is deformed about an edge of the part joined to the image pickup element 120 when the optical module 130 is joined to the flexible board 110.

This deformation of the flexible board 110 may cause a reduced accuracy of the position in the flexible board 110 where the optical module 130 is joined to or a connection failure between the joining terminal 112 and the bump 122 of the image pickup element 120 in the flexible board 110.

Therefore, in a case where the optical module 130 is joined to the flexible board 110, to prevent the flexible board 110 from being deformed, the camera module 1 includes the reinforcing member 140 that reinforces the part of the flexible board 110 to be joined to the optical module 130.

The reinforcing member 140 had a thickness equal to or greater than a thickness of the image pickup element 120 and is joined on the rear face of the flexible board 110, to which the image pickup element 120 is joined, so as to be placed at a circumference of the image pickup element 120.

The reinforcing member 140 is joined to the flexible board 110, using the bonding material 152, so that the reinforcing member 140 faces an area including at least a part where the flexible board 110 and the optical module 130 are joined. The reinforcing member 140 is formed so that a part of the circumference of the image pickup element 120 is kept open.

Therefore, the reinforcing member 140 having a thickness equal to or greater than the thickness of the image pickup element 120 is provided along the outer circumference of the optical module 130 without sealing the circumference of the image pickup element 120.

The camera module 1 composed as described above is produced by joining the optical module 130 on the front face of the flexible board 110 after joining the image pickup element 120 and reinforcing member 140 on the rear face of the flexible board 110.

Therefore, in a case where the optical module 130 is joined to the flexible board 110, the flexible board 110 can be prevented from being deformed since the part of the flexible board 110 to be joined with the optical module 130 is supported by the reinforcing member 140 having a thickness equal to or greater than the thickness of the image pickup element 120.

As a result, reduction of accuracy of the positioning of the optical module 130 or a connection failure between the joining terminal 112 of the flexible board 110 and the bump 122 of the image pickup element 120, which is caused by the deformation of the flexible board 110, can be prevented.

Furthermore, in the camera module 1, the reinforcing member 140 is composed so that a part of the circumference of the image pickup element 120 is kept open and the circumference of the image pickup element 120 is not sealed. Therefore, reduction of dissipation performance of heat generated in the image pickup element 120 can be prevented (the heat dissipation performance can be maintained).

Here, in general, in a case where the thickness of the reinforcing member 140 is made equal to or greater than the image pickup element 120 as described above, when the flexible board 110 having joined with the image pickup element 120 and reinforcing member 140 is placed on a flat plane, bottom faces of both of the image pickup element 120 and the reinforcing member 140 or the bottom face of the reinforcing member 140 contact with the flat plane. Then, as a result, the part of the flexible board 110 joined with the optical module 130 is solidly supported by the reinforcing member 140, and the deformation of the flexible board 110 in a case where the optical module 130 is joined to the flexible board 110 can be sufficiently prevented.

Note that, in an actual installation, due to a height of the bumps 122 of the image pickup element 120, a thickness of the bonding material 152, or the like used to join the reinforcing members 140 to the flexible board 110, even in a case, for example, where the thickness of the reinforcing member 140 is made equal to the thickness of the image pickup element 120, the bottom faces of the reinforcing member 140 may not contact with the flat plane in some cases when the flexible board 110 joined with the image pickup element 120 and reinforcing members 140 is placed on the flat plane. This may reduce a degree to prevent the deformation of the flexible board 110 in a case where the optical module 130 is joined to the flexible board 110.

Therefore, in an actual installation, in a case where the optical module 130 is joined to the flexible board 110, and the image pickup element 120 and reinforcing member 140 are joined to the flexible board 110 to sufficiently prevent the flexible board 110 from being deformed as illustrated in FIG. 2 and FIG. 3, it is preferable to determine the thickness of the reinforcing member 140 so that the bottom face of the reinforcing member 140 is placed in a same flat plane with the bottom face of the image pickup element 120 or projected downward compared to the bottom face of the image pickup element 120.

The thickness of the reinforcing member 140 to make the bottom face of the reinforcing member 140 to be in the same flat plane with the bottom face of the image pickup element 120 or to project downward compared to the bottom face of the image pickup element 120 in a case where the image pickup element 120 and reinforcing member 140 are joined to the flexible board 110 as described above will also be referred to as a support thickness.

<Examples of Joining Reinforcing Member 140>

FIGS. 4A, 4B, 4C, 4D, and 4E are diagrams for describing how the reinforcing member 140 is joined to the flexible board 110.

In other words, FIGS. 4A, 4B, 4C, 4D, and 4E are exploded perspective views and exploded sectional views of an outline of the camera module 1 and illustrates examples of position relationship between a joining part BP of the flexible board 110 where the optical module 130 is joined and the reinforcing member 140.

Note that, in FIGS. 4A, 4B, 4C, 4D, and 4E, to simplify the drawings, illustration of the image pickup element 120 is omitted.

As described with reference to FIG. 2 and FIG. 3, for example, since the optical module 130 has a substantially box-shaped package which is open in its bottom side and hollowed inside, the joining part BP of the flexible board 110 to be joined with the optical module 130 becomes a substantially rectangular shape which is hollow (its inside is a hollow space) as illustrated in FIG. 4A.

The reinforcing member 140 reinforces the joining part BP, which is in a substantially rectangular hollow shape; more specifically, at least four corners of the joining part BP, for example.

In other words, in FIGS. 2, 3, 4A, 4B, 4C, 4D, and 4E, the reinforcing member 140 is formed as four L-shaped members, which are substantially L-shaped plates, so that a part of the circumference of the image pickup element 120 opens in a case where the reinforcing member 140 is joined to the flexible board 110.

Then, the L-shaped members included in the reinforcing member 140 are joined to the flexible board 110, for example, so that the L-shaped members face the four corners of the substantially rectangular joining part BP. The L-shaped members have its bar-shaped parts made to be sufficiently shorter than a side of the substantially rectangular joining part BP so that sufficient openings are formed between the L-shaped members in a case where the L-shaped members are joined to the flexible board 110.

Furthermore, a thickness of the L-shaped members is made to be the support thickness for example, to support the flexible board 110 in a case where the optical module 130 is joined to the flexible board 110.

In a case where the reinforcing member 140 is formed with four L-shaped members and the four L-shaped members are joined to the flexible board 110 so that they face the four corners of the joining part BP as described above, since the flexible board 110 is supported by the reinforcing member 140 while the optical module 130 is connected to the flexible board 110, this can prevent the flexible board 110 from being deformed due to the force applied to the joining part BP.

Furthermore, since a part of the circumference of the image pickup element 120 is kept open after joining the joining members 140 to the flexible board 110, this can prevent the heat dissipation performance to dissipate the heat generated in the image pickup element 120 from being reduced.

The joining of the reinforcing member 140 to the flexible board 110 can be performed so that the reinforcing member 140 faces to an entirety of the joining part BP in a width direction (the horizontal direction in FIGS. 4A, 4B, 4C, 4D, and 4E) or so that the reinforcing member 140 faces an area including at least a part of the joining part BP in the width direction.

In other words, for example, as illustrated in FIG. 4B, L-shaped members having a width almost same as the width of the joining part BP can be used as the reinforcing member 140, and the reinforcing member 140 can be joined so that those L-shaped members serving as the reinforcing member 140 (almost) completely overlap with the joining part BP in the width direction.

Furthermore, for example, as illustrated in FIG. 4C, L-shaped members having a width greater than the width of the joining part BP can be used as the reinforcing member 140, and the reinforcing member 140 can be joined so that those L-shaped members serving as the reinforcing member 140 include the entire width direction of the joining part BP.

Furthermore, for example, as illustrated in FIG. 4D, L-shaped members having a width smaller than the width of the joining part BP can be used as the reinforcing member 140, and the reinforcing member 140 can be joined so that those L-shaped members of the reinforcing member 140 are included in the width direction of the joining part BP.

Furthermore, for example, L-shaped members having any width can be used as the reinforcing member 140 and, as illustrated in FIG. 4E, such reinforcing member 140 can be joined so that a part of the L-shaped members serving as the reinforcing member 140 overlaps with a part of the joining part BP in the width direction.

Note that, in FIG. 4E, the reinforcing member 140 is joined so as to overlap with an outer part of the joining part BP (an outer part of the optical module 130); however, in addition to this example, the reinforcing member 140 may be joined so as to overlap with an inner part of the joining part BP (an inner part of the optical module 130).

In a case where the reinforcing member 140 is joined so as to face an area including at least a part of the joining part BP as described above, since the joining part BP is supported by the reinforcing member 140 while the optical module 130 is joined to the flexible board 110, the flexible board 110 is prevented from being deformed.

<Production Method of Camera Module 1>

FIG. 5 is a diagram for describing an example of a production method of the camera module 1.

In step S11, an unillustrated camera module manufacturing apparatus that produces the camera module 1 turns the rear face of the flexible board 110 as an individual piece upward and applies the bonding material 152 to a part of the flexible board (FPC) 110 where the reinforcing member 140 is joined (not shown in FIG. 5).

Here, the bonding material 152 may be applied to only a part of the flexible board 110 where the L-shaped members included in the reinforcing member 140 are joined or may be applied to any area on the rear face of the flexible board 110 including a part where the L-shaped members included in the reinforcing member 140 are joined, such as an entire area facing the joining part BP.

Here, in a case where the bonding material 152 is applied to an arbitrary area including a part where the L-shaped members composing the reinforcing member 140 are joined, the bonding material 152 needs to be applied so as to maintain an air permeability of the circumference of the image pickup element 120. In other words, the bonding material 152 needs to be applied so that the opening part between the L-shaped members composing the reinforcing member 140 is not completely sealed by the bonding material 152 after the reinforcing member 140 is joined to the flexible board 110.

In step S12, the camera module manufacturing apparatus places and presses the reinforcing member 140 on the rear face of the flexible board 110 and joins the reinforcing member 140 to the rear face of the flexible board 110 with the bonding material 152.

Here, in a case where the reinforcing member 140 is joined, the L-shaped members included in the reinforcing member 140 are placed, for example, in the four corners of the joining part BP so that the L-shaped members face an area including at least a part of the joining part BP in the width direction.

In step S13, the camera module manufacturing apparatus joins the image pickup element 120 on the rear face of the flexible board 110 by flip chip bonding, for example.

Here, in step S13, in addition to the image pickup element 120, a passive element such as a chip capacitor (not shown in FIG. 5) may be joined to the rear face of the flexible board 110. The passive element can be joined at a position on the flexible board 110 between the image pickup element 120 and the reinforcing member 140 or outside the reinforcing member 140.

In step S14, the camera module manufacturing apparatus inverts the flexible board 110 on which the image pickup element 120 and reinforcing member 140 is joined, and orient the front face of the flexible board 110 upward. Furthermore, the camera module manufacturing apparatus applies the bonding material 151 on the joining part BP of the flexible board 110 (not shown in FIG. 5).

Here, in step S14, a functional glass such as an infrared ray cut filter (IRCF) can be further joined to the flexible board 110 so as to cover the opening 111 of the flexible board 110.

In step S15, the camera module manufacturing apparatus places and presses the optical module 130 on the front face of the flexible board 110 and joins the optical module 130 to the front face of the flexible board 110 with the bonding material 151.

In a case where the optical module 130 is joined, since the reinforcing member 140 joined on the rear face of the flexible board 110 supports at least the four corners of the joining part BP on the flexible board 110 where the optical module 130 is joined, this can prevent the flexible board 110 from being deformed even in a case where the optical module 130 is pressed onto the flexible board 110.

Note that, referring FIG. 5, it has been described that the reinforcing member 140 is joined to the flexible board 110 and after that, the image pickup element 120 is joined; however, the joining of the reinforcing member 140 and the joining of the image pickup element 120 may be performed in an opposite order or at the same time.

<Configuration Examples of Reinforcing Member 140>

Figure 6A:
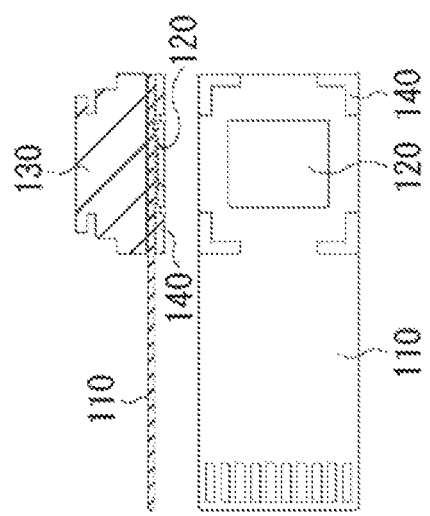
FIGS. 6A, 6B, and 6C are diagrams illustrating configuration examples of the reinforcing member 140.
Figure 6B:
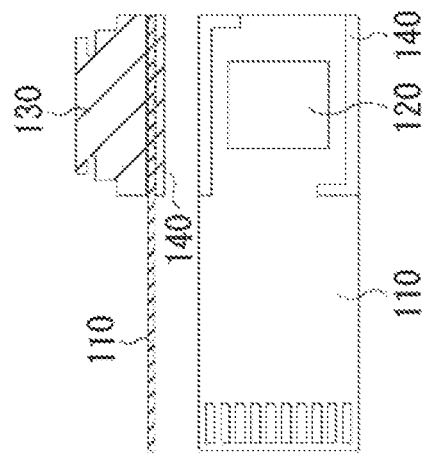
Figure 6C:
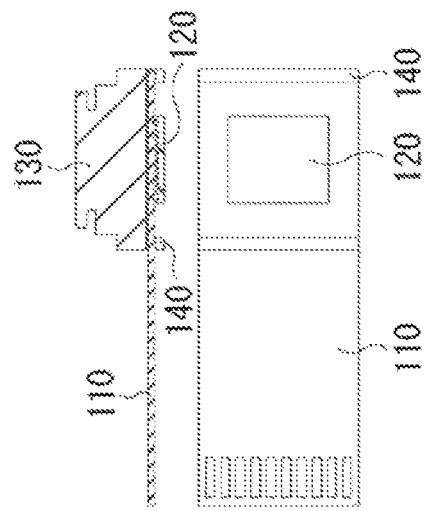

FIGS. 6A, 6B, and 6C are diagrams illustrating configuration examples of the reinforcing member 140.

FIGS. 6A, 6B, and 6C are sectional views of the camera module 1 in a state that the reinforcing member 140 is joined, and bottom views of the camera module 1 as seen from the rear face side of the flexible board 110.

The reinforcing member 140 can be formed to reinforce at least four corners of the substantially rectangular hollow joining part BP.

FIG. 6A illustrates a first configuration example of the reinforcing member 140 that reinforces at least the four corners of the joining part BP.

In FIG. 6A, the reinforcing member 140 includes four L-shaped members where the bar-shaped parts of the L shape are made sufficiently shorter than one side of the joining part BP in a substantially rectangular shape, as described with reference to FIGS. 4A, 4B, 4C, 4D, and 4E.

Then, in FIG. 6A, the four L-shaped members serving as the reinforcing member 140 are joined so as to face the four corners of the substantially rectangular joining part BP of the flexible board 110, as described with reference to FIGS. 4A, 4B, 4C, 4D, and 4E.

FIG. 6B illustrates a second configuration example in which the reinforcing member 140 that reinforces at least four corners of the joining part BP.

In FIG. 6B, the reinforcing member 140 includes two L-shaped members where one of bar-shaped parts of the L shape is made sufficiently shorter than the side of the substantially rectangular joining part BP and the other of the bar-shaped parts is made in almost the same length with the side of the substantially rectangular joining part BP.

Then, in FIG. 6B, the two L-shaped members serving as the reinforcing member 140 are respectively joined so as to face two opposite sides of the substantially rectangular joining part BP of the flexible board 110.

FIG. 6C illustrates a third configuration example in which the reinforcing member 140 reinforces at least four corners of the joining part BP.

In FIG. 6C, the reinforcing member 140 includes two bar-shaped members in almost the same length with the sides of the substantially rectangular joining part BP.

Then, in FIG. 6C, the two bar-shaped members serving as the reinforcing member 140 are respectively joined so as to face two opposite sides of the substantially rectangular joining part BP of the flexible board 110.

FIG. 7 is a diagram illustrating another configuration example of the reinforcing member 140.

In other words, FIG. 7 illustrates a fourth configuration example of the reinforcing member 140 that reinforces at least four corners of the joining part BP.

As in the cases of FIGS. 6A, 6B, and 6C, FIG. 7 is a sectional view of the camera module 1 to which the reinforcing member 140 is being joined and a bottom view of the camera module 1 seen from the rear face of the flexible board 110.

In FIG. 7, as in the case of the joining part BP of the flexible board 110, the reinforcing member 140 includes a hollow member in a substantially rectangular shape.

Furthermore, in FIG. 7, the reinforcing member 140 has a cutout 141 that is concaved in its thickness direction and penetrates between an outside and an inside of the reinforcing member 140.

Then, in FIG. 7, the hollow member in a substantially rectangular shape serving as the reinforcing member 140 is joined so as to face the substantially rectangular joining part BP of the flexible board 110.

In the reinforcing member 140 in FIG. 7, the cutout 141 functions as an opening in a part of the circumference of the image pickup element 120 so that air permeability and heat dissipation performance in the circumference of the image pickup element 120 can be maintained.

Here, in FIG. 7, the cutout 141 is provided in one place of the hollow reinforcing member 140 in a substantially rectangular shape; however, the cutout 141 may be provided in a plurality of positions in the reinforcing member 140. Furthermore, the cutouts 141 in the plurality of positions may be provided only in one side of the substantially rectangular reinforcing member 140 or may be provided in more than one side.

Furthermore, in FIG. 7, a width of the cutout 141 is made sufficiently shorter than the length of the side of the substantially rectangular reinforcing member 140; however, the width of the cutout 141 may be made longer (for example, a half or a third of the length of the side of the substantially rectangular reinforcing member 140, or the like). Furthermore, in the reinforcing member 140, as a substitute for the cutout 141, a tunnel-shaped hole that penetrates between the outside and inside of the reinforcing member 140 may be provided.

In contrast to the reinforcing member 140 in FIGS. 6A, 6B, and 6C including a plurality of members, the reinforcing member 140 in FIG. 7 includes a single substantially rectangular member having the cutout 141. Therefore, in a case where the reinforcing member 140 in FIG. 7 is employed, a fewer numbers of actions to align members included in the reinforcing member 140 is required to join the reinforcing member 140 to the flexible board 110 and the manufacturing the camera module 1 can be simplified.

Note that the configuration of the reinforcing member 140 is not limited to the configurations illustrated in FIGS. 6A, 6B, 6C, and 7. In other words, as the reinforcing member 140, a member in any shape can be employed as long as it satisfies conditions that the member can be joined to the flexible board 110 so that the member faces an area including at least a part of the joining part BP where the optical module 130 is joined to prevent the flexible board 110 from being deformed when the optical module 130 is joined to the flexible board 110, and that a part of the circumference of the image pickup element 120 is kept open to maintain the air permeability in the circumference of the image pickup element 120.

Furthermore, as the thickness of the reinforcing member 140 that includes a member formed in any shape including the configurations illustrated in FIGS. 6A, 6B, 6C and 7, the support thickness described with reference to FIG. 3 can be employed.

<Other Configuration Examples of Camera Module 1>

Figure 8A:
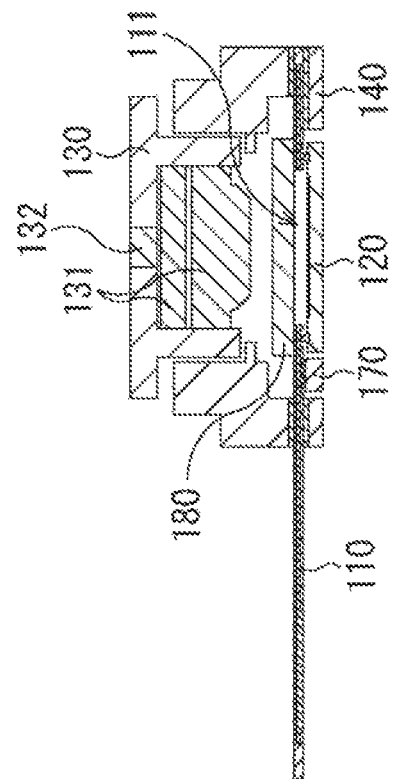
FIGS. 8A and 8B are sectional views illustrating other configurations of the camera module 1.
Figure 8B:
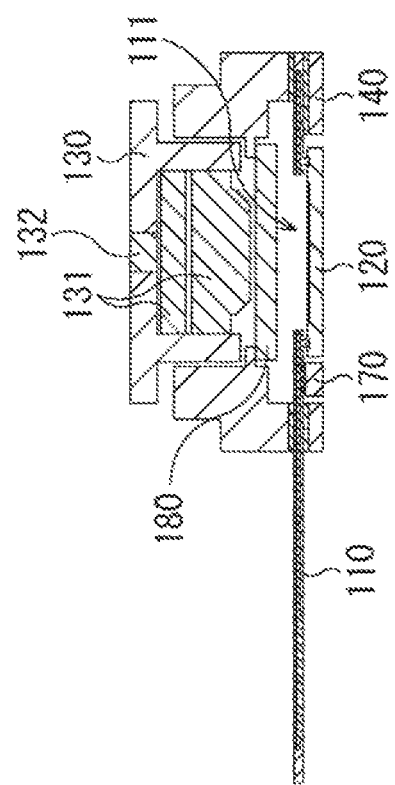

FIGS. 8A and 8B are sectional views illustrating other configuration examples of the camera module 1.

Note that, in the drawing, parts corresponding to those in FIG. 2 and FIG. 3 are applied with the same reference numerals and explanation thereof will be omitted according to need.

In FIGS. 8A and 8B, the camera module 1 incudes the flexible board 110, the image pickup element 120, the optical module 130, the reinforcing member 140, a functional glass 170, and a passive element 180.

Therefore, the camera module 1 in FIGS. 8A and 8B are common with the cases in FIG. 2 and FIG. 3 on that the flexible board 110, image pickup element 120, optical module 130, and reinforcing member 140 are included.

However, the camera module 1 in FIGS. 8A and 8B is different from the cases in FIG. 2 and FIG. 3 on that a functional glass 170 and a passive element 180 are newly provided.

The passive element 170 is, for example, a passive element such as a chip capacitor for coupling, decoupling, or the like and joined to the flexible board 110 between the image pickup element 120 and reinforcing member 140 in FIGS. 8A and 8B.

Joining to the passive element 170 to the flexible board 110 can be performed at the same time when the image pickup element 120 is joined to the flexible board 110.

The functional glass 180 is, for example, an IRCF, blue glass, or the like, and is mounted on the camera module 1 so as to cover the opening 111 of the flexible board 110 and also the light receiving surface 121 of the image pickup element 120 in FIGS. 8A and 8B.

As a method to mount the functional glass 180 on the camera module 1, for example, there are a method for mounting the functional glass 180 on a lower part of the lens 131 of the optical module 130 as illustrated FIG. 8A and a method for mounting the functional glass 180 on the flexible board 110 so as to cover the opening 111 as illustrated in FIG. 8B.

<Installation Example of Camera Module 1>

Figure 9A:
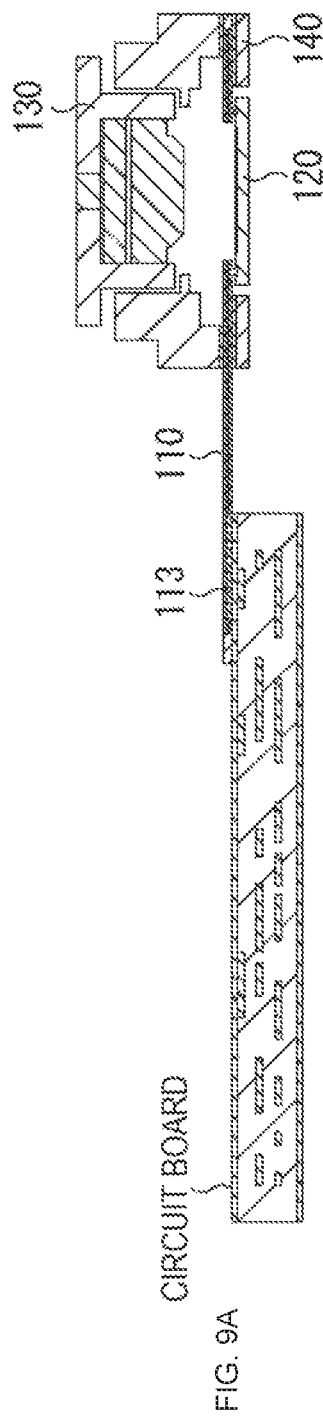
FIGS. 9A and 9B are sectional views illustrating an example of how the camera module 1 is mounted to an external circuit board.
Figure 9B:
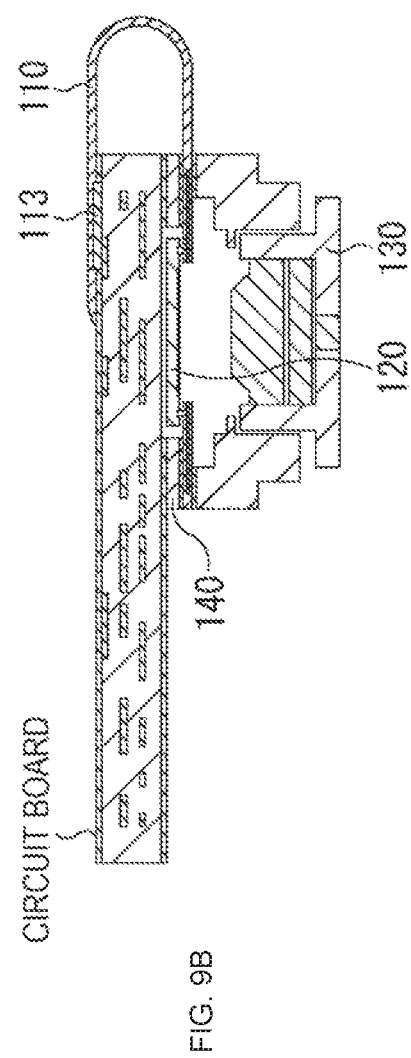

FIGS. 9A and 9B are sectional views illustrating an installation example that the camera module 1 is installed to an outer circuit board.

In a case where the camera module 1 is installed on the signal processing board 2 or an outer circuit board such as a motherboard, for example, as illustrated in FIG. 9A, the camera module 1 can be installed on the circuit board by electrically connecting the upper face of the circuit board and the mounting electrode 113 of the flexible board 110 so that the a flat plane as the circuit board and a flat plane of the flexible board 110 overlap and the front face of the flexible board 110 is oriented upward as the camera module 1 is oriented to capture an image upward.

Furthermore, for example, the camera module 1 can be installed on the circuit board in a manner that, while the upper face of the circuit board is being electrically connected with the mounting electrode 113 of the flexible board 110 as illustrated in FIG. 9A, the part of the flexible board 110 where the image pickup element 120 and optical module 130 are joined is folded downward and joined to a lower face of the circuit board as illustrated in FIG. 9B.

<Usage Examples of Camera Module 1>

Figure 10:
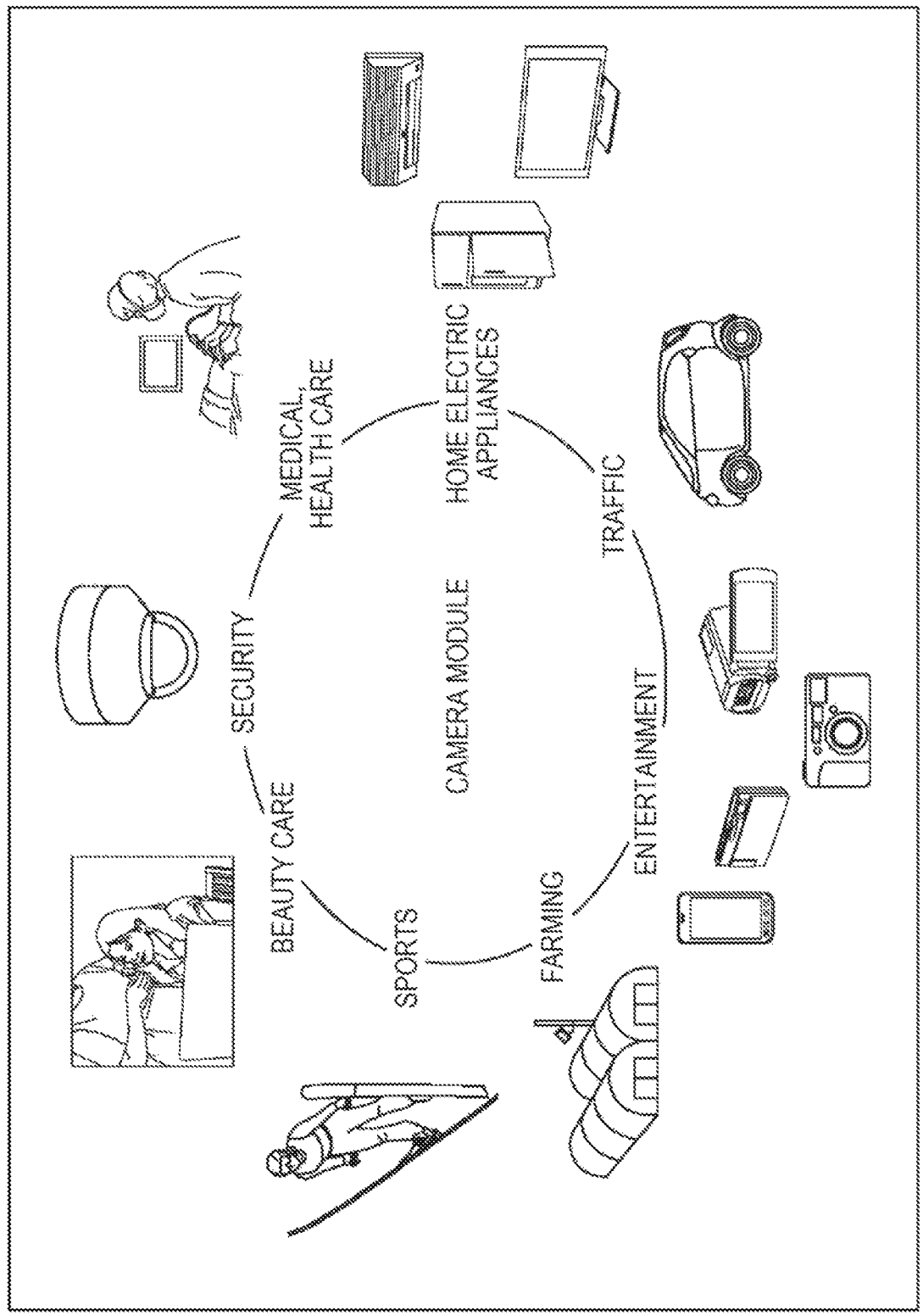

FIG. 10 is a diagram illustrating a usage example of how the camera module 1 is used.

The camera module 1 can be used in various electronic devices that sense light such as visible light, infrared light, ultraviolet light, or X-ray, for example.

- An electronic device used to capture an image to be viewed, such as a digital camera, a cell phone including a camera function, or the like
- An electronic device used for traffic, such as a vehicle-mounted sensor for capturing an image in front and back of a vehicle, surroundings, vehicle interior or the like, a monitoring camera for monitoring traveling vehicles or streets, a distance measurement sensor for measuring a distance between vehicles, or the like in purpose of safe driving such as automatic stopping, recognition of driver's condition, and the like
- An electronic device provided in home electric appliances such as a TV, a refrigerator, an air conditioner, and the like, to capture an image of user's gesture and perform a device operation according to the gesture
- An electronic device used in medical or health care, such as an endoscope, an electron microscope, an angiography device using a reception of infrared light
- An electronic device for security, such as a monitoring camera for crime prevention, a camera for person identification, or the like
- An electronic device for beauty care, such as a skin measurement device for capture an image of a skin, a microscope for capturing an image of a scalp, or the like
- An electronic device for sports, such as an action camera, a wearable camera, or the like used for sports
- An electronic device for farming, such as a camera for monitoring a condition of a field or farm products Note that the embodiment according to the present technology is not limited to the above described embodiment and various changes can be made within the scope of the present technology.

Furthermore, the effects described in this specification are examples and should not be limited and there may be other effects.

Note that the present technology may have the following configurations.

<1>

A camera module including:

a flexible board having an opening corresponding to a light receiving surface of an image pickup element, which includes the light receiving surface to receive light;

the image pickup element joined to one face of the flexible board so that the light receiving surface is exposed through the opening;

an optical module joined to an other face of the flexible board so that the light enters to the image pickup element through the opening; and a reinforcing member joined to the one face of the flexible board at a circumference of the image pickup element and configured to reinforce a joining part of the flexible board where the optical module is joined, in which the reinforcing member is joined so as to face an area including at least a part of the joining part and is formed so that a part of the circumference of the image pickup element is kept open.

<2>

The camera module according to <1>, in which the reinforcing member has a thickness that allows a bottom face of the reinforcing member to be placed in a same plane with a bottom face of the image pickup element or to be projected as compared to the bottom face of the image pickup element.

<3>

The camera module according to <1>, in which a shape of the joining part is substantially rectangular, and the reinforcing member reinforces at least four corners of the substantially rectangular joining part.

<4>

The camera module according to any one of <1>to <3>, in which the reinforcing member is hollowed in a shape surrounding the circumference of the image pickup element and has a cutout that penetrates between an outside and an inside of the reinforcing member.

<5>

The camera module according to any one of <1>to <4>, further including a passive element joined to the flexible board.

<6>

The camera module according to any one of <1>to <5>, in which the optical module includes a functional glass.

<7>

The camera module according to any one of <1>to <5>, further including a functional glass joined to the flexible board so as to cover the opening.

<8>

A camera module production method including:

joining an image pickup element to one face of a flexible board that has an opening corresponding to a light receiving surface of the image pickup element, which includes the light receiving surface to receive light, so that the light receiving surface is exposed through the opening, and joining a reinforcing member on the flexible board at a circumference of the image pickup element to reinforce a joining part of the flexible board where an optical module is joined; and joining the optical module on an other side of the flexible board so that the light enters to the image pickup element through the opening, in which the reinforcing member is joined so as to face an area including at least a part of the joining part and is formed so that a part of the circumference of the image pickup element is kept open.

<9>

An electronic device including:
a camera module configured to capture an image; and
a signal processor configured to perform signal processing on the image captured by the camera module,
in which
the camera module includes:
a flexible board having an opening corresponding to a light receiving surface of an image pickup element, which includes the light receiving surface to receive light;
the image pickup element joined to one face of the flexible board so that the light receiving surface is exposed through the opening;
an optical module joined to an other face of the flexible board so that the light enters to the image pickup element through the opening; and
a reinforcing member joined to the one face of the flexible board at a circumference of the image pickup element and configured to reinforce a joining part of the flexible board where the optical module is joined, and
the reinforcing member
is joined so as to face an area including at least a part of the joining part and
is composed so that a part of the circumference of the image pickup element is kept open.

REFERENCE SIGNS LIST

1 Camera module
2 Signal processing board
3 Memory
4 Signal processor
5 Output unit
6 Control unit
110 Flexible board
111 Opening
112 Joining terminal
113 Mounting electrode
120 Image pickup element
121 Light receiving surface
122 Bump
130 Optical module
131 Lens
132 Transparent member
140 Reinforcing member
141 Cutout
151, 152 Bonding material
170 Passive element
180 Functional glass

The invention claimed is:

1. A camera module, comprising:
an image pickup element having a light receiving surface to receive light;
a flexible board having an opening corresponding to the light receiving surface of the image pickup element, wherein the image pickup element is joined to a first face of the flexible board to expose the light receiving surface through the opening;
an optical module joined to a second face of the flexible board so that the light enters to the image pickup element through the opening; and
a reinforcing member joined to the first face of the flexible board at a circumference of the image pickup element, wherein
the reinforcing member is configured to reinforce a joining part of the flexible board where the optical module is joined,
a thickness of the reinforcing member is equal to a thickness of the image pickup element,
the reinforcing member is joined so as to face an area including at least a part of the joining part, and
the reinforcing member keeps open a part of the circumference of the image pickup element.

2. The camera module according to claim 1, wherein the reinforcing member has the thickness that allows a bottom face of the reinforcing member to be placed in a same plane with a bottom face of the image pickup element.

3. The camera module according to claim 1, wherein
a shape of the joining part is substantially rectangular, and
the reinforcing member is further configured to reinforce at least four corners of the substantially rectangular joining part.

4. The camera module according to claim 1, wherein the reinforcing member is hollowed in a shape surrounding the circumference of the image pickup element and has a cutout that penetrates between an outside and an inside of the reinforcing member.

5. The camera module according to claim 1, further comprising a passive element joined to the flexible board.

6. The camera module according to claim 1, wherein the optical module includes a functional glass.

7. The camera module according to claim 1, further comprising a functional glass joined to the flexible board so as to cover the opening.

8. A camera module production method, comprising:
joining an image pickup element to a first face of a flexible board, wherein
the first face has an opening corresponding to a light receiving surface of the image pickup element,
the light receiving surface receives light, and
the light receiving surface is exposed through the opening;
joining a reinforcing member on the flexible board at a circumference of the image pickup element to reinforce a joining part of the flexible board where an optical module is joined, wherein a thickness of the reinforcing member is equal to a thickness of the image pickup element; and
joining the optical module on a second face of the flexible board so that the light enters to the image pickup element through the opening, wherein
the reinforcing member is joined so as to face an area including at least a part of the joining part, and
the reinforcing member is formed to keep open a part of the circumference of the image pickup element.

9. An electronic device, comprising:
a camera module configured to capture an image; and
a signal processor configured to perform signal processing on the image captured by the camera module, wherein the camera module comprises:
an image pickup element having a light receiving surface to receive light;
a flexible board having an opening corresponding to the light receiving surface of the image pickup element, wherein the image pickup element is joined to a first face of the flexible board to expose the light receiving surface through the opening;
an optical module joined to a second face of the flexible board so that the light enters to the image pickup element through the opening; and
a reinforcing member joined to the first face of the flexible board at a circumference of the image pickup element, wherein the reinforcing member is configured to reinforce a joining part of the flexible board where the optical module is joined,
a thickness of the reinforcing member is equal to a thickness of the image pickup element,
the reinforcing member is joined so as to face an area including at least a part of the joining part, and
the reinforcing member keeps open a part of the circumference of the image pickup element.

* * * * *